US006864486B2

(12) United States Patent
Alekseev et al.

(10) Patent No.: US 6,864,486 B2
(45) Date of Patent: Mar. 8, 2005

(54) ION SOURCES

(75) Inventors: Valery V. Alekseev, Moscow (RU); Vsevolod V. Zelenkov, Moscow (RU); Mark M. Krivoruchko, Zelenograd (RU); John E. Keem, Bloomfield Hills, MI (US)

(73) Assignee: Veeco Instruments, Inc., Woodbury, NY (US)

( * ) Notice: Subject to any disclaimer, the term of this patent is extended or adjusted under 35 U.S.C. 154(b) by 40 days.

(21) Appl. No.: 10/221,545

(22) PCT Filed: Feb. 11, 2002

(86) PCT No.: PCT/RU02/00041

§ 371 (c)(1), (2), (4) Date: Oct. 21, 2003

(87) PCT Pub. No.: WO02/093987

PCT Pub. Date: Nov. 21, 2002

(65) Prior Publication Data

US 2004/0195521 A1 Oct. 7, 2004

(30) Foreign Application Priority Data

May 16, 2001 (RU) ....................................... 2001112999

(51) Int. Cl.$^{7}$ ........................ H05H 1/92; H01L 21/306; H01J 17/04; H01J 27/00

(52) U.S. Cl. ................... 250/423 R; 250/424; 250/427; 250/530; 313/359.1; 313/360.1; 313/361.1; 315/11.41; 315/111.91

(58) Field of Search ............................. 250/423 R, 424, 250/427, 396 R, 396 ML, 530, 426; 315/111.91, 111.41, 111.21, 111.61, 111.81; 313/238–293, 359.1, 360.1, 361.1, 362.1

(56) References Cited

U.S. PATENT DOCUMENTS

| | | | | | |
|---|---|---|---|---|---|
| 4,122,347 | A | | 10/1978 | Kovalsky et al. | |
| 4,277,304 | A | | 7/1981 | Horiike et al. | |
| 5,359,258 | A | * | 10/1994 | Arkhipov et al. | 313/359.1 |
| 5,763,989 | A | * | 6/1998 | Kaufman | 313/361.1 |
| 5,798,602 | A | * | 8/1998 | Gopanchuk et al. | 313/359.1 |
| 5,945,781 | A | * | 8/1999 | Valentian | 315/111.81 |
| 5,973,447 | A | * | 10/1999 | Mahoney et al. | 313/359.1 |
| 6,037,717 | A | * | 3/2000 | Maishev et al. | 315/111.91 |
| 6,130,507 | A | * | 10/2000 | Maishev et al. | 315/111.81 |
| 6,150,764 | A | * | 11/2000 | Hruby et al. | 315/111.61 |
| 6,208,080 | B1 | * | 3/2001 | King et al. | 315/111.41 |
| 6,525,480 | B1 | * | 2/2003 | Hargus et al. | 315/111.21 |

FOREIGN PATENT DOCUMENTS

EP 0541309 5/1993

* cited by examiner

*Primary Examiner*—John R. Lee
*Assistant Examiner*—Bernard E. Souw

(57) ABSTRACT

A closed loop exit hole is formed in a magnetically permeable end wall (2) of an enclosure (1) of a closed electron drift ion source. Parts of this end wall separated by the exit hole serve as pole pieces (7 and 8) of the magnetic system and define the first pole gap. The magnetic system includes pole pieces (9 and 10), which define the second pole gap made in the form of a closed loop exit hole and arranged along the direction of ion emission. Magnetomotive force sources (5 and 6) are located in space between two groups of magnetic terminals. The ratio of width of each pole gap and distance between pole pieces of the first (7 and 8) and second (9 and 10) magnetic gaps along the direction of ion emission is not less than 0.05.

The invention allows the intensity of the generated ion beam and the energy of ions to be increased, and this is provided by the homogeneous distribution of ion current density across the ion beam section.

31 Claims, 6 Drawing Sheets

ION SOURCES

FIELD OF THE INVENTION

The invention relates to plasma technology and, more particularly, it pertains to plasma devices designed for the generation of intensive ion beams, including extended cylindroid beams that may be used in ion beam technologies for modifying article surfaces and for sputter deposition of coatings onto article surfaces.

BACKGROUND OF THE INVENTION

Currently available are various types of ion sources adapted for the generation of ion beams including closed electron drift (or closed Hall current) ion sources. Such ion sources are subdivided into two types: ion sources with an extended acceleration zone comprising a dielectric channel (for example, European application EP 0 541 309 A1, IPC H05H1/54, F03H 1/100, published May 12, 1993), and ion sources with a short acceleration zone (for example, the patent U.S. Pat. No. 4,122,347, IPC H01J 27/00, published Sep. 24, 1978), which are also referred to as anode layer ion sources. The second type of closed electron drift ion sources is most generally employed for processing purposes, because:

- a separate electron emitter is not needed for operation of such ion sources,
- such ion sources are free from ion acceleration dielectric channels,
- the anode-to-cathode distance may be minimal,
- anode layer ion sources are of simpler design and provide for generation of extended cylindroid ion beams of large linear sizes,
- the ion source enclosure is generally used as a cathode.

The Russian patent RU 2030807 (IPC H01J 27/04, 37/08, published Mar. 10, 1995) describes a closed electron drift ion source designed for the generation of extended cylindroid beams. The prior art ion sources comprise an enclosure fabricated from magnetically permeable material and adapted for serving as a cathode. A gas distributor communicated with the ion source enclosure is designed for supplying a working gas into a discharge gap. An elongated emission hole made in the discharge end wall of the ion source enclosure is defined by parallel rectilinear portions and two closing curved portions. An anode is symmetrically positioned in the cavity of the ion source enclosure, opposite to the slot-shaped emission hole. The anode is positioned axisymmetrically around permanent magnets which are located between the ion source enclosure end walls to generate a magnetic field in the working gap of the slot-shaped emission hole. Parts of the magnetically permeable discharge end wall of the ion source enclosure opposite to the slot-shaped emission hole are acting as pole pieces of the magnetic system of the device. The pole pieces together with magnetically permeable components of the enclosure are electrically isolated one from another and are grounded through current measuring devices. The configuration and intensity of the generated ion beams is controlled by changing the profile of the emission hole and the pole piece distance. On the whole, the design of the prior art ion source provides for reduced sputtering of the pole pieces and, as a result, an increased purity of the ion beam, reduced contamination in sputtered depositions and improved quality of the ion beam processed articles surfaces.

There exists a number of constructive designs directed to improve the magnetic system for closed electron drift ion sources resulting in increased intensity of the ion beam. As an example, a prior art closed electron drift ion source comprises an improved magnetic system (the patent U.S. Pat. No. 5,763,989, IPC H 05 H1/02, published Jun. 9, 1998). The magnetic system for such an ion source comprises magnetomotive force sources made in the form of permanent magnets, a magnetic circuit and magnetically permeable shields surrounding the coaxial discharge channel of the device. The magnetic system is adapted for generation in the discharge channel of a radial magnetic field with predetermined axial field gradient. This ion source belongs to the class of plasma devices with an extended acceleration zone and needs an additional electron emitter positioned behind the coaxial discharge channel section.

The closest prior art embodiment of the present invention is an extended cylindroid ion beam source based on the principle of acceleration of ions in an anode layer with closed electron drift (the patent U.S. Pat. No. 4,277,304, IPC H01L 21/306, H01 J 17/04, published Jul. 7, 1981). In this embodiment, the ion source enclosure is provided with a closed loop slot-shaped exit hole for ion emission and for generation of an extended cylindroid ion beam. The anode of the ion source is positioned inside the enclosure cavity opposite to the exit hole. A working gas distributor is communicated with the cavity of the enclosure and, accordingly, with the ion source discharge channel. A cathode of the prior art ion source is the enclosure or a portion of the enclosure and the end wall with the closed loop exit hole for ion emission. The ion source end wall with the exit hole is fabricated from magnetically permeable material (magnetically permeable steel).

The prior art technical design is directed to the creation of a compact extended cylindroid beam ion source and to the reduction of leakage of magnetic flux by the optimized construction of the magnetic system. The magnetic system for the ion source comprises permanent magnets arranged on outside of the enclosure, along edges of the closed loop slot-shaped exit hole. The magnetic field induction vectors of permanent magnets arranged at opposite edges of the exit hole are oriented parallel to the direction of ion emission and have opposite polarity. The enclosure end wall with an elongated closed loop exit hole is fabricated from magnetically permeable material. Parts of the enclosure end wall separated by the closed loop exit hole serve as pole pieces of the magnetic system and define a magnetic working gap along the closed loop exit slot.

In the prior art, pole pieces are also positioned on outer end surface parts of permanent magnets and adapted for conducting the magnetic flux around the outside of the enclosure thereby preventing the magnetic flux from leaking outside the discharge channel. In some embodiments of the device (see, as an example, FIG. 6 of the patent U.S. Pat. No. 4,277,304), outer pole pieces of the magnetic system are connected by means of magnetic flux conducting jumpers. Thus, the outside pole pieces of the prior art ion source are designed only for concentrating the magnetic flux within the cavity of the magnetic circuit enclosure and do not serve as magnetic elements defining an additional magnetic working gap. Acceleration of ions in such device is effectuated in crossed electric and magnetic fields in the region of the magnetic working gap adjacent to the anode. The pole pieces arranged on end surfaces of permanent magnets and interconnected through magnetic flux conducting jumpers, as is shown in FIG. 6 of the patent U.S. Pat. No. 4,277,304, define the exit hole of the ion source and do not exert a substantial effect upon the ion beam formation process. In another specific embodiment of the ion source (see FIG. 8A of the patent U.S. Pat. No. 4,277,304), the pole pieces positioned on end surfaces of permanent magnets define a second magnetic gap, where additional acceleration of ions in crossed electric and magnetic fields is theoretically possible. However, the patent U.S. Pat. No. 4,277,304 does not indicate specific conditions determining the distribution of the magnetic field in the magnetic lens, which forms at the exit hole of the ion source and serves to generate an ion beam. Hence, it is unjustified to draw the conclusion of a possible effect of the second magnetic gap of the magnetic lens used in the prior art device upon the ionization and the ion acceleration processes.

Among significant operating parameters for ion sources used in processing are ion beam current density, uniformity of ion current density across the ion beam section and the electric discharge stability. The above characteristics, in their turn, depend upon the precise dimensions of the emission hole, uniform distribution of magnetic and electric fields in the magnetic working gap, as well as upon uniformity of a working gas supply along the emission hole. The fulfillment of these conditions is of particular value for generation of extended cylindroid beams. In addition, these conditions promote obtaining the desired high ion current density per unit of length of the emission hole by enabling the production of high-power density discharges in the working gap behind the emission hole. On the whole, currently available ion sources are not suited to producing the above mentioned required conditions and, because of this, have limited possibility for application in a broad range of desired ion beam processes.

SUMMARY OF INVENTION

The present invention is directed to increasing the intensity of the ion beam over a wide range of ion energies and providing the homogeneous distribution of the high ion current density. This objective is of great importance for efficient, high productivity implementation of many different ion beam processes, for example ion etching, ion beam sputter deposition, direct deposition, ion beam assisted deposition etc. The claimed technical results depend upon solution of the problems related to the realization of optimum conditions for ionization of the working gas and ion acceleration, including the possibility of controlling the energy thereof across the ion beam section by effective employment of a second magnetic gap and a magnetic lens. The solution of this group of problems is of particular value for generation of high current density extended cylindroid beams along the exit hole.

The aforesaid results are realized by means of an ion source comprising an enclosure with a closed loop exit hole for ion emission, an anode located inside the enclosure opposite to the exit hole, a gas distributor communicated with the cavity of the enclosure, a cathode, with at least a part thereof being defined by the enclosure, and a magnetic system including at least one magnetomotive force source made in the form of a permanent magnet. The magnetomotive force source is arranged outside of the enclosure, along the edge of closed loop exit hole. The enclosure end wall with the closed loop exit hole is fabricated from magnetically permeable material, with parts of the end wall separated by the closed loop exit hole forming pole pieces of the magnetic system and defining a first magnetic gap. The magnetic system comprises pole pieces defining a second pole gap made in the form of a closed loop exit hole and positioned opposite the first pole gap in the direction of ion emission. The magnetomotive force source is disposed in the space between pole pieces of the first and second pole gaps. Further, according to the first embodiment of the present invention, the ratio of width of each pole gap and distance between the pole pieces of the first and second pole gaps in the direction of ion emission is not less than 0.05. Also, the enclosure end wall on the side opposite to the exit hole for ion emission must be manufactured from magnetically permeable material. The said end wall defines in conjunction with the pole pieces in the first and second magnetic gaps an open magnetic circuit. The remaining parts of the enclosure may be manufactured from nonmagnetic material.

The present embodiment of the ion source provides a second pole gap forming a magnetic quadrapole lens. A closed Hall current generated in the second pole gap provides for additional ionization of the working gas and enhances the magnetic field in the first pole gap which helps to stabilize the discharge and the ion acceleration process. Also with the second gap, conditions are created for effective additional ion acceleration. This possibility is realized by selecting the appropriate geometric ratio of distances between pole pieces in both gaps, such that the interaction of internal magnetic fields generated by the closed electron drift currents and the magnetic field generated by the magnetic system of the ion source results in a net increase in magnetic field. Another advantage of the present invention is derived when a magnetically permeable end wall is used in conjunction with the four-pole (quadrapole) magnetic lens. In this case, an open magnetic circuit is created which results in an increase in magnetic field gradient in the first pole gap and improves the uniformity of the distribution of the magnetic field along the exit hole of the ion source which provides greater and more uniform ion acceleration.

The magnetic system may comprise permanent magnets arranged between pole pieces in the first and second pole gaps, along opposite edges of the closed loop exit hole. The magnetic field induction vectors in the permanent magnets arranged in the vicinity of the opposite edges of the exit hole are oriented parallel to the direction of ion emission and have opposite polarity. The present embodiment intensifies the magnetic field and improves the uniformity of distribution of magnetic field strength in the pole gaps.

It should be noted that only one permanent magnet might be used as a magnetomotive force source in the ion source executed in accordance with an independent claim of the invention. To generate a magnetic field in two successive pole gaps, the single magnetomotive force source may be made of closed loop-shape type and may be arranged along the outer edge of the exit hole (as shown in FIG. 4A of the patent U.S. Pat. No. 4,277,304), or, alternatively, it may be made of open-shape type and arranged along the inner edge of the exit hole (as shown in FIG. 8A of the patent U.S. Pat. No. 4,277,304).

A preferred embodiment of the invention may use an internal magnetic flux conducting jumper for connecting the opposite end walls of the enclosure. In this case, the anode of closed loop-shape conforming that of the exit hole is formed and arranged around the internal magnetic flux conducting jumper of the enclosure.

It is advantageous to use an additional permanent magnet as an internal magnetic flux conducting jumper. The magnetic field induction vector of the additional magnet is oriented parallel to the direction of ion emission and has opposite polarity with respect to the magnetic field induction vector of the magnet arranged opposite to the additional magnet, on the outside of the enclosure.

Additional permanent magnets may be arranged around the anode, between magnetically permeable end walls of the enclosure, with the magnetic field induction vector of each additional magnet being oriented parallel to the direction of ion emission and having opposite polarity with respect to the magnetic field induction vector of the permanent magnet arranged opposite thereof, on the outside of the enclosure. Incorporation of additional permanent magnets into the open magnetic circuit enhances the uniform distribution of the magnetic field in the pole gaps and, thereby, provides for homogeneous distribution of current density and ion energy across the section of ion beam.

Additional permanent magnets may be arranged centrally or circumferentially on the enclosure, as well as both centrally and circumferentially thereon.

The extended cylindroid ion beams are generated by means of pole gaps defining a closed loop exit hole for ion emission made in the form of a closed loop emission slot. The closed loop slot-shaped hole consists of two parallel rectilinear portions closed at their ends with curved portions.

The width of one rectilinear portion of at least one pole gap may be greater than the width of the other rectilinear portion of the same pole gap. Such embodiment of ion source allows in effect two parallel ion beams with different current densities and ion energy values to be generated and is sufficiently versatile to be used in technologies requiring successive processing of the article surfaces with ion beams of various intensity.

In the preferred embodiment of ion source the ratio of width of the first pole gap and distance between the surface of anode and the opposite edge of the pole piece defining the first pole gap is 1–20. The indicated dimension ratio provides for stable ion beam generation in the process of execution of various operations with different widths of the exit hole. For ion sputtering, as an example, a narrow exit hole is needed, and for ion deposition a wide exit hole is needed. With the observance of the set ratio, intensive ion beams with required distribution of ion energy in the beam may be generated.

It is advisable that roughness of the working surface of anode and working surfaces of pole pieces adjacent to the discharge channel not be in the excess of 10 microns. Elimination of asperities on the working surface of anode eliminates points where the electric field intensity becomes concentrated which in turn reduces local overheating of the anode surface. Hall current heating of these asperities can create electric breakdowns in an anode-to-cathode space. Eliminating these sources of electrical breakdown improves the stability of discharge, increases the range of discharge intensities available and increases the service life of the ion source.

The preferred embodiment of ion source uses a gas distributor comprising at least one gas-distributing unit with outlet passages uniformly arranged along the closed loop exit hole for ion emission. The outlet passages of the gas-distributing unit are of equal section and are communicated with a single inlet opening through series-parallel connected linear passages having equal flow resistance. The outlet passages are connected to a collector to which are joined series-parallel connected passages in the region between two adjacent outlet passages, while two outlet passages are arranged between the points where two adjacent inlets of series-parallel connected passages are joined to the collector. The described embodiment of the gas distributor provides for equal gas flow through each outlet passage, uniform supplying of the working gas along the discharge channel between the anode and the cathode and, consequently, homogeneous current density of the ion beam along the exit hole.

The gas-distributing unit may be located in the ion source enclosure on the side opposite to the exit hole, or it may be alternatively a part of the magnetic system. In the latter case, at least a part of the gas-distributing unit functions as an element of the magnetic circuit.

The above mentioned technical results are also disclosed in accordance with the second embodiment of the invention. The ion source in the second embodiment of the invention, as well as in the first embodiment of the invention, comprises an enclosure with a closed loop exit hole for ion emission, an anode arranged inside the enclosure opposite to the exit hole, a gas distributor communicated with the cavity of the enclosure, a cathode at least partially defined by the enclosure, and a magnetic system including at least one magnetomotive force source made in the form of a permanent magnet. The magnetomotive force source is disposed on the outside of the enclosure, along the edge of the closed loop exit hole. The enclosure end wall with a closed loop exit hole is manufactured from magnetically permeable material. The parts of this end wall separated by the closed loop exit hole serve as pole pieces of the magnetic system, which define the first magnetic gap. The magnetic system comprises pole pieces defining the second pole gap formed as a closed loop exit hole and positioned opposite to the first pole gap in the direction of ion emission, with the magnetomotive force source being disposed in the space between the pole pieces of the first and second gaps. According to the second embodiment of the invention, the ratio of width of each pole gap and distance between the pole pieces of the first and second magnetic gaps in the direction of ion emission is not less than 0.05. It is also disclosed that the pole pieces defining the second pole gap be electrically isolated from the enclosure and from the pole pieces defining the first pole gap.

The second embodiment of the invention, as well as the first one, provides for the increased intensity of the ion beam by optimal uniform distribution of the magnetic field which, as a result, stabilizes the discharge and increases the ion acceleration for a homogeneous distribution of ion current density across the ion beam section. Along with this, the second embodiment provides for regulation of ion energy in the beam by controlling the potential of the pole pieces in the second pole gap or by fixing the potential value at a predetermined level.

According to the second embodiment of the invention, the ion source enclosure may be totally manufactured from a magnetically permeable material.

The magnetic system, much like in the first embodiment, may incorporate permanent magnets arranged between the pole pieces of the first and second pole gaps, along the opposite edges of the closed loop exit hole. The magnetic field induction vectors of the permanent magnets arranged in the vicinity of opposite edges of the exit hole are oriented parallel to the direction of ion emission and have opposite polarity.

To generate the magnetic field in the pole gaps of the magnetic system of the ion source, in accordance with an independent claim, only one permanent magnet may be used as a magnetomotive force source.

To electrically isolate the pole pieces of the second pole gap, the permanent magnets are manufactured from the material offering high resistivity. Electrical isolation may also be provided by arranging dielectric inserts between the pole pieces, defining the second pole gap, and the permanent magnets. In this case, the pole pieces will be at the system floating potential during the operation of the ion source.

According to another version of the embodiment, the polar pieces defining the first and the second pole gaps may be connected to opposite terminals of the voltage source. This allows the intensity of the ion beam and ion energy value to be regulated by controlling the potential of the pole pieces of the second pole gap.

In the preferred form of the second embodiment of the ion source, an internal magnetic flux conducting jumper may be used for connecting opposite end walls of the enclosure. In this case, the anode is made of closed loop-shape type conforming to that of the exit hole and is arranged around the internal magnetic flux conducting jumper of the enclosure.

It is advisable to use an additional permanent magnet as an internal magnetic flux conducting jumper. The magnetic field induction vector of the additional magnet is oriented parallel to the direction of ion emission and has opposite polarity with respect to the magnetic field induction vector of the magnet arranged opposite thereof, on the outside of the enclosure.

Additional permanent magnets may be placed around the anode, between the magnetically permeable end walls of the enclosure, with the magnetic field induction vector of each additional magnet being oriented parallel to the direction of ion emission and having opposite polarity with respect to the magnetic field induction vector of the magnet positioned opposite thereof, on the outside of the enclosure.

To generate extended cylindroid beams, the pole gaps defining a closed loop exit hole for ion emission are used, with the exit hole being made in the form of a closed loop emission slot. The closed loop slot-shaped emission hole is composed of two parallel rectilinear portions closed at their ends with curved portions.

To extend the functional capabilities of the ion source, the width of one rectilinear portion of at least one pole gap may be greater than that of the other rectilinear portion of the same pole gap. The embodiment permits utilization of two successive pole gaps with different width of the rectilinear portions.

In the preferred second embodiment of the ion source, the ratio of width of the first pole gap and distance between the surface of anode and the opposite edge of the pole piece defining the first pole gap is 1–20.

To increase the range of discharge intensities available and the service life of the ion source, it is advisable that the roughness of the working surface of anode and working surfaces of pole pieces adjacent to the discharge channel not be in the excess of 10 microns.

The preferred second embodiment of the ion source incorporates a gas distributor comprising at least one gas-distributing unit with outlet passages uniformly arranged along a closed loop exit hole for ion emission. The outlet passages of the gas-distributing unit have equal section and are communicated with a single inlet opening through series-parallel connected linear passages having equal flow resistance. The outlet passages are connected to a collector, to which are joined series-parallel connected passages in the region between two adjacent outlet passages, while two outlet passages are arranged between the points where two adjacent inlets of series-parallel connected passages are joined to the collector. The present embodiment of the gas distributor provides for equal gas flow through each outlet passage.

The gas-distributing unit may be located in the enclosure on the side opposite to the exit hole for ion emission, or may be alternatively a part of the magnetic system. In the latter case, at least a part of the gas-distributing unit functions as an element of a magnetic circuit.

BRIEF DESCRIPTION OF THE DRAWINGS

The embodiments of the invention are further explained through description of the particular examples of accomplishment and applied drawings illustrating the following.

DESCRIPTION OF THE PREFERRED EMBODIMENTS

Figure 1:
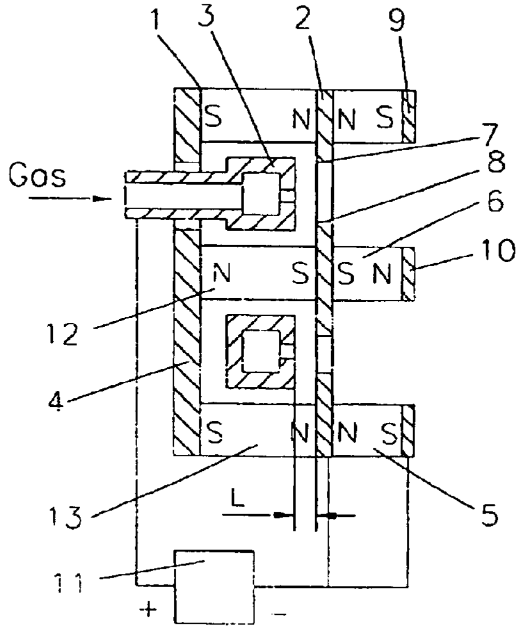
FIG. 1 is a diagrammatic sectional view of the ion source in accordance with the first embodiment of the invention.

The invention is explained with the examples given below and is related to the utilization of an ion source for generation of extended cylindroid ion beams. The distinctive features of the working examples of the ion source are that a closed loop exit hole for ion emission is made in the form of an elongated closed loop emission slot (the disclosed term is further used for the particular example of the exit hole for ion emission).

The ion source, in accordance with the first embodiment of the invention, (see FIGS. 1 through 3) is comprised of an enclosure 1 having an end wall 2 provided with a closed loop exit hole for ion emission made in the form of an elongated closed loop emission slot. An anode 3 is arranged inside enclosure 1 opposite to the emission slot. The ion source is further provided with a gas distributor, which may be structurally combined with anode 3. The magnetic system of the device is comprised of magnetomotive force sources, pole pieces and magnetically permeable wall 4 of enclosure 1. The magnetomotive force sources are made in the form of permanent magnets 5 and 6 arranged on the outside of enclosure 1 along edges of the closed loop emission slot. End wall 2 is manufactured of magnetically permeable material and is also a part of the magnetic system. The parts of end wall 2, separated by the closed loop emission slot, function as pole pieces 7 and 8 defining the first pole gap downstream in the ion emission direction. The magnetic system is further provided with pole pieces 9 and 10 defining the second pole gap formed as a closed loop emission slot (see FIG. 2) and arranged opposite to the first pole gap in the direction of ion emission. Permanent magnets 5 and 6 are positioned between pole pieces of the first and second pole gaps along opposite edges of the exit hole (the closed loop emission slot). The magnetic field induction vectors of permanent magnets 5 and 6 are oriented parallel to the direction of ion emission and have opposite polarity due to the respective orientation of magnetic poles (N-S, S-N).

Magnetically permeable end walls 2 and 4 define in conjunction with pole pieces 7,8 and 9,10 an open magnetic circuit, which creates a magnetic field with a predetermined field gradient in the vicinity of the working surface of anode 3. End wall 4 is manufactured from magnetically permeable steel and functions as a magnetic shunt for the magnetic leakage flux generated by the magnetomotive force sources. Such magnetic shunt is arranged at the rear side of enclosure 1 (on side opposite to the exit hole for ion emission).

The predetermined distribution of the magnetic field in the first and second pole gaps is provided by the appropriate selection of the magnetic circuit dimension ratio. The ratio of the width of each pole gap and the distance between pole pieces 7,8 of the first pole gap and pole pieces 9,10 of the second pole gap downstream in the ion emission direction is not less than 0.05. The disclosed condition determines the quadrapole distribution of the magnetic field in a four-pole (quadrapole) magnetic lens defined by two pairs of pole pieces 7,8 and 9,10 and determines the strength of interaction between the internal magnetic fields of the drift electron currents and the magnetic field established by means of the magnetic system. In the example of the particular version of the magnetic circuit (see FIGS. 1 and 3), the ratio of width of the first pole gap and distance between paired pole pieces 7,8 and 9,10 is approximately 0.5, and this ratio for the case of the second pole gap is approximately 1.5, which satisfies the disclosed dimension limits.

Figure 4:
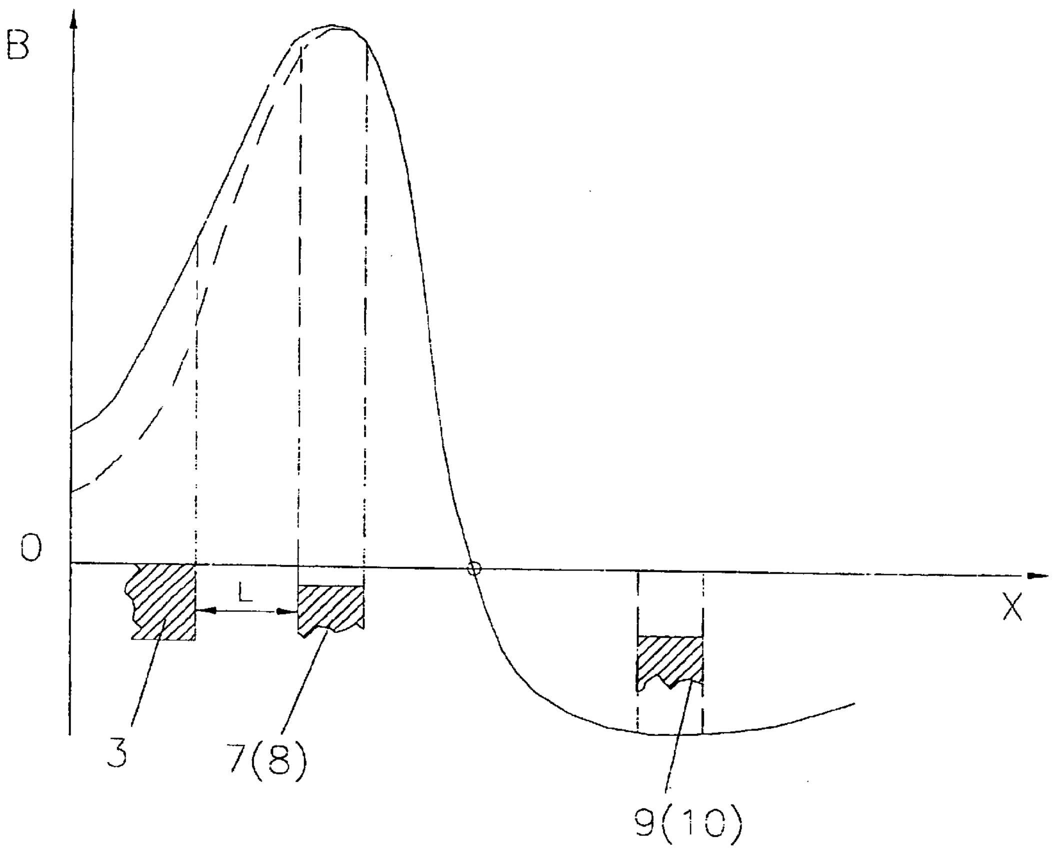
FIG. 4 is a representation of the variation of value of magnetic field component B along direction X of ion emission for the ion source illustrated in FIG. 3.
Figure 5:
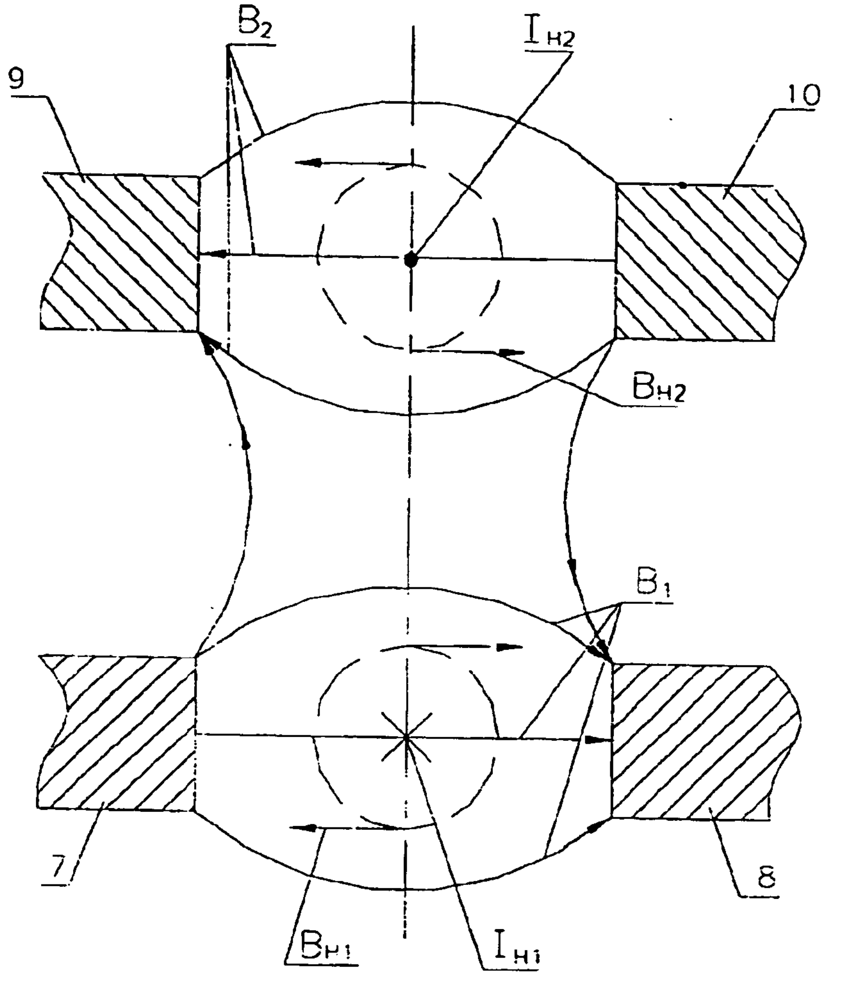
FIG. 5 is a pictorial representation of interaction of magnetic fields generated in pole gaps of a quadrapole magnetic system.

Variation of the component of the magnetic field in the direction X of ion emission (B) for selected geometry of the magnetic system is illustrated by the dashed line on the curve in FIG. 4 (the full line in FIG. 4 shows the dependence of B, when the magnetic system does not use a magnetic shunt). The distribution of the magnetic field in pole gaps for this example geometry of the magnetic system including the effects of the magnetic fields induced by the closed Hall currents is illustrated in FIG. 5.

The particular example of the embodiment of the ion source under consideration uses a cathode defined by enclosure 1 with pole pieces 7,8 and pole pieces 9,10 of the second pole gap. The said pole pieces are connected to the negative terminal of the voltage source 11, with positive terminal of the voltage source 11 being connected to anode 3.

Figure 3:
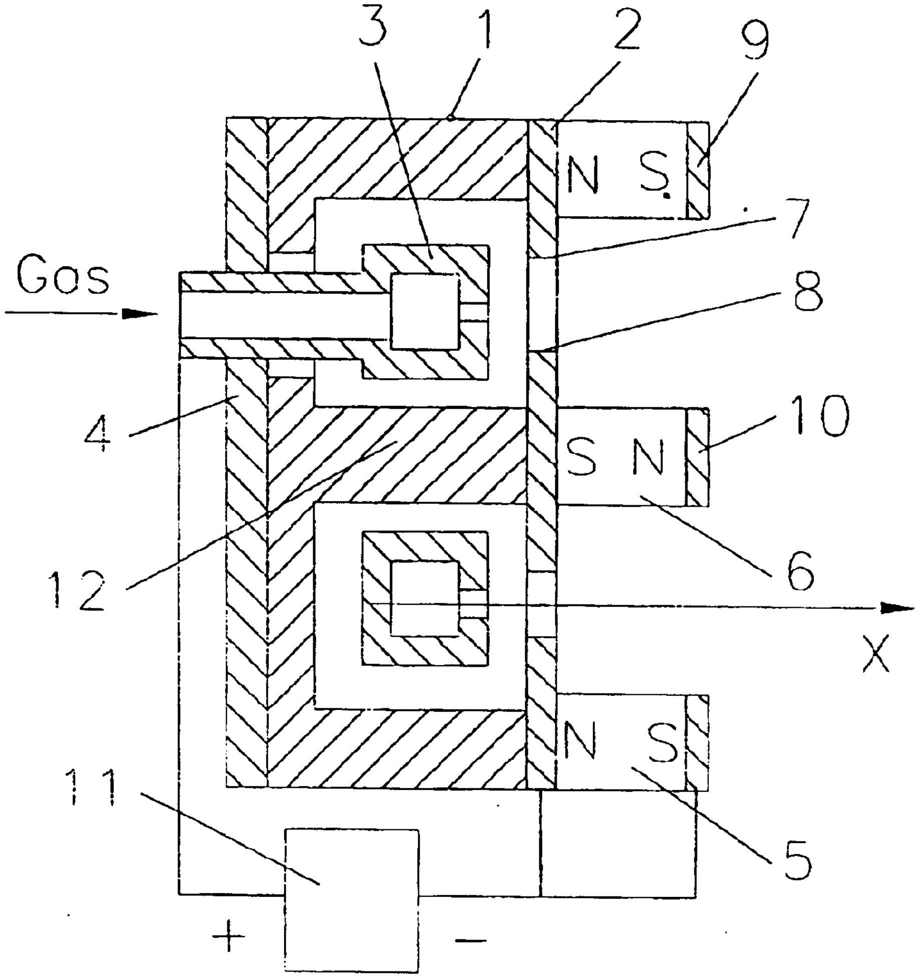
FIG. 3 is a diagrammatic sectional view of the ion source in accordance with the first embodiment of the invention using only outer permanent magnets.

Enclosure 1 of ion source comprises an internal magnetic flux conducting jumper 12 for magnetically and physically connecting the opposite end walls. Anode 3 is of closed loop shape conforming to that of the closed loop emission slot and is arranged around internal magnetic flux conducting jumper 12 of the enclosure 1. The part of the enclosure together with internal magnetic flux conducting jumper 12 may be fabricated from nonmagnetic material, as is shown in FIG. 3. A preferred embodiment of ion source (see FIG. 1) uses an additional permanent magnet as internal magnetic flux conducting jumper 12. The magnetic field induction vector of such a magnet (magnetic flux conducting jumper 12) is oriented parallel to the direction of ion emission and has opposite polarity (through the polarity of the magnet) with respect to the magnetic field induction vector of magnet 6 positioned on the outside of enclosure 1.

In the embodiment of the ion source illustrated in FIG. 1, an additional permanent magnet 13 of closed loop shape is positioned around anode 3 between magnetically permeable end walls 2 and 4 of enclosure 1. The magnetic field induction vector (magnet polarity) of additional magnet 13 is oriented parallel to the direction of ion emission and has opposite polarity with respect to the magnetic field induction vector of a permanent magnet 5 on the outside of enclosure 1.

The pole gaps between paired pole pieces 7,8 and 9,10 define a closed loop slot-shaped hole for ion emission. Each gap is composed of two parallel rectilinear portions closed at their ends with closing curved portions (see FIG. 2). In the ion source of the embodiment under consideration which is designed for performing different processes with each portion, the width $C_1$ of the first rectilinear portion of the first pole gap exceeds the width $C_2$ of the second rectilinear portion of the same gap.

The ratio of width ($C_1$ or $C_2$) of the first pole gap and distance L between the surface of anode 3 and opposite edges of pole pieces 7 and 8 defining the first pole gap is approximately between 2 and 4 for the first and second rectilinear portions of the gap, respectively. The selection of said dimensions is within the optimum range of 1–20. The mean roughness of the working surface of anode 3 and the working surfaces of pole pieces 7,8 and 9, 10 facing toward the discharge channel is 5 microns.

Figure 6:
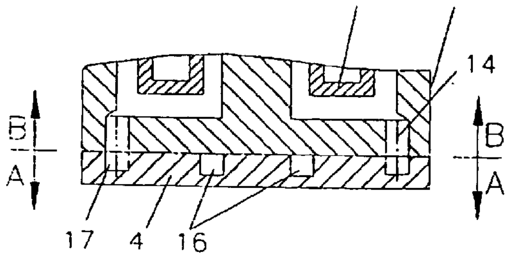
FIG. 6 is a diagrammatic sectional view of a part of the ion source with the gas distributor (in the plane of outlet passages)
Figure 7:
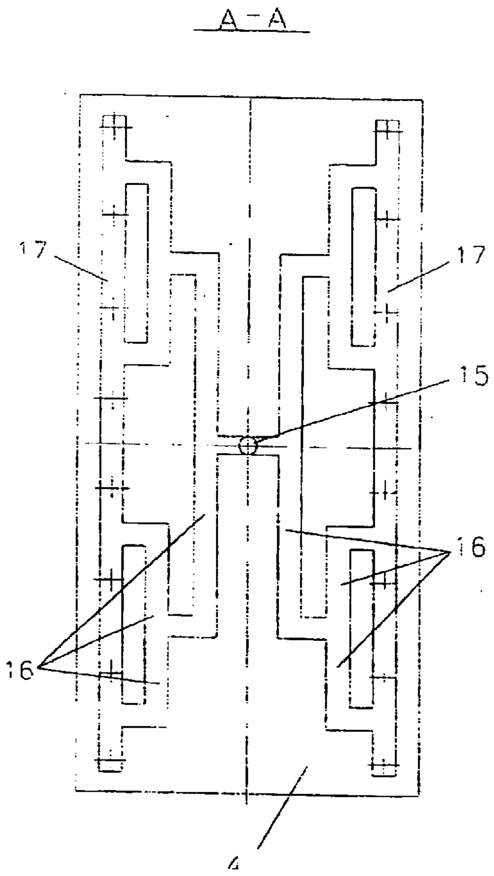
FIG. 7 is a sectional view of the gas distributor illustrated in FIG. 6 in the plane of direction A.
Figure 8:
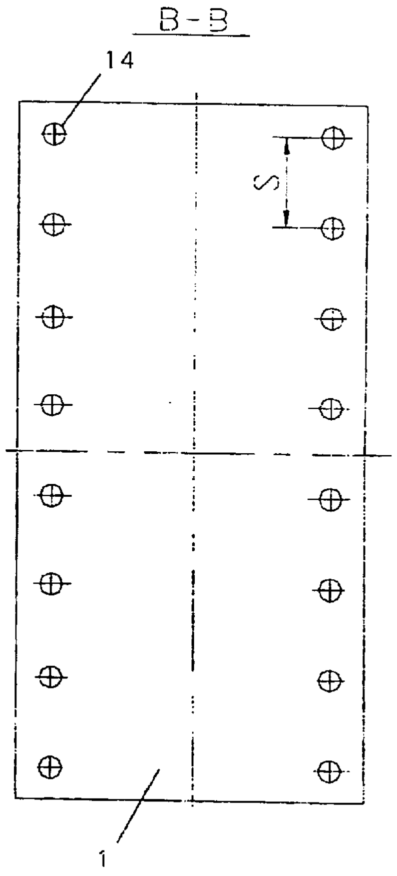
FIG. 8 is a sectional view of the gas distributor illustrated in FIG. 6 in the plane of direction B.

In the preferred embodiment illustrated in FIGS. 6 through 8, the ion source is comprised of a separate gas-distributing unit that is not structurally connected to anode 3. The gas-distributing unit includes a magnetically permeable end wall 4 serving as a magnetic shunt and a rear part of enclosure 1 contacting end wall 4 on the side opposite to the exit hole. The gas distributor is joined to the enclosure cavity through outlet passages 14 having equal diameters and arranged in two rows in an equally spacing relationship over the internal wall of enclosure 1, along rectilinear portions of the closed loop exit hole for ion emission. Magnetically permeable end wall 4 is fixed to the rear wall of enclosure 1 and is provided with an inlet opening 15, which is communicated through a cascade of series-parallel connected passages 16 with two parallel collectors 17. Outlet passages 14 are connected to collectors 17 and arranged lengthwise thereof, at uniform distance H from one another (see FIG. 8). Inlet opening 15 is connected through an inlet pipe to a working gas supply system (not shown in the drawing). Series-parallel connected passages 16, which establish communication between the inlet opening 15 and outlet passages 14, have equal flow resistance providing for equal flow of gas supplied into a discharge volume through outlet passages 14. Uniform flow of gas directed through outlet passages 14 is also provided because each passage 16 at the point of connection thereof with collector 17 is arranged between two adjacent outlet passages 14, while two outlet passages 14 are arranged between the points where two adjacent inlets of passages 16 are joined to collector 17 (see FIG. 7).

The extended cylindroid beam ion source made according to the second embodiment of the invention (see FIGS. 9 through 12) is comprised of an enclosure 18 with an end wall 19 provided with a closed loop slot-shaped exit hole for ion emission. An anode 20 is located inside enclosure 18 opposite to the closed loop ion emission hole. The ion source is further comprised of a gas distributor which may be structurally combined with anode 20. The magnetic system of the device includes magnetomotive force sources made in the form of permanent magnets 21,22 and pole pieces 23,24 and 25,26.

The parts of end wall 19 separated by the closed loop emission hole serve as pole pieces 23 and 24 which define a first pole gap downstream in the direction of ion emission. Pole pieces 25 and 26 define a second pole gap opposite to the first pole gap in the direction of ion emission. Permanent magnets 21 and 22 are arranged between pole pieces 23,25 and 24,26, respectively. The polarity of magnets 21 and 22 (N-S and S-N) is selected so that magnetic field induction vectors of the magnets arc oriented parallel to the direction of ion emission and have opposite polarity. The desired distribution of magnetic field in the first and second pole gaps is obtained by appropriately selecting the dimension ratios of the magnetic circuit. The selected ratio of the width of each pole gap and the distance between pole pieces 23 and 24 of the first pole gap and pole pieces 25 and 26 of the second pole gap in the direction of ion emission is not less than 0.05. As with the first embodiment of the invention, the ratio of width of the first pole gap and distance between pairs of pole pieces 23,24 and 25,26 is approximately 0.5 and the same ratio for the second pole gap is approximately 1.5, which is consistent with the selected limitations.

In contrast to the first embodiment of the invention, pole pieces 25 and 26 defining the second pole gap are electrically isolated from enclosure 18 and from pole pieces 23 and 24 defining the first pole gap by dielectric inserts 27 and 28 (see FIGS. 9 through 12). Yet other methods of electrical isolation of pole pieces 25 and 26 from the remaining parts of enclosure 18 are possible. As an example, permanent magnets 21, 22 may be fabricated from materials possessing high resistivity (barium ferrite, strontium ferite etc).

Figure 9:
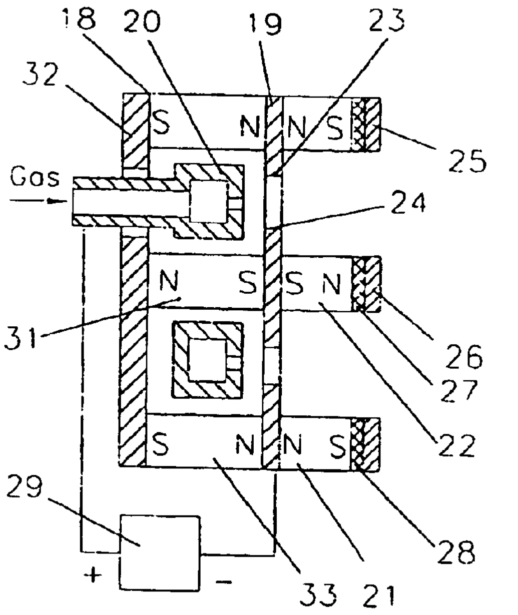
FIG. 9 is a diagrammatic sectional view of the ion source in accordance with the second embodiment of the invention and equipped with a single voltage source and additional permanent magnets.
Figure 10:
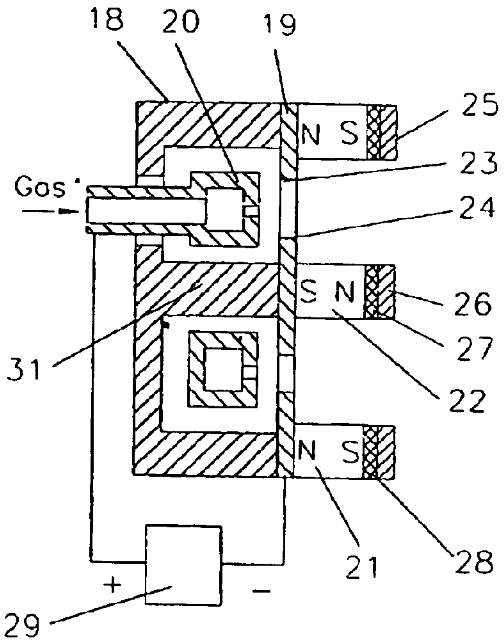
FIG. 10 is a diagrammatic sectional view of the ion source in accordance with the second embodiment of the invention and equipped with a single voltage source.

In the particular considered embodiment of ion source, a cathode is formed by enclosure 18 with pole pieces 23 and 24, which is connected to the negative terminal of a voltage source 29. The positive terminal of voltage source 29 is connected to anode 20. Electrically isolated pole pieces 25 and 26 may rise to the floating potential of the system, as is shown in FIGS. 9 and 10, or may be connected to an additional voltage source 30 (see FIGS. 11 and 12). Different modes of operation of the ion source are possible according to whether pole pieces 25 and 26 are connected to the positive terminal or to the negative terminal. This allows for the acceleration or deceleration of the ions in the extended cylindroid beam.

In the considered embodiment of the invention, enclosure 18 of the ion source comprises an internal magnetic flux conducting jumper 31, which connects opposite end walls thereof. Anode 20 is made of closed loop shape conforming to that of the exit hole and is positioned around internal magnetic flux conducting jumper 51 of the enclosure. As opposed to the first embodiment of the invention, enclosure 18 together with internal magnetic flux conducting jumper 31 may be totally manufactured from nonmagnetic or magnetically soft material (see FIGS. 10 and 12). The preferred embodiment of the ion source (see FIGS. 9 and 11) uses an additional permanent magnet as internal magnetic flux conducting jumper 31. The magnetic field induction vector of such a magnet (magnetic flux conducting jumper 31) is oriented parallel to the direction of ion emission and has opposite polarity (through the polarity of the magnet) with respect to the magnetic field induction vector of a magnet 22 positioned on the outside of enclosure 18.

Figure 11:
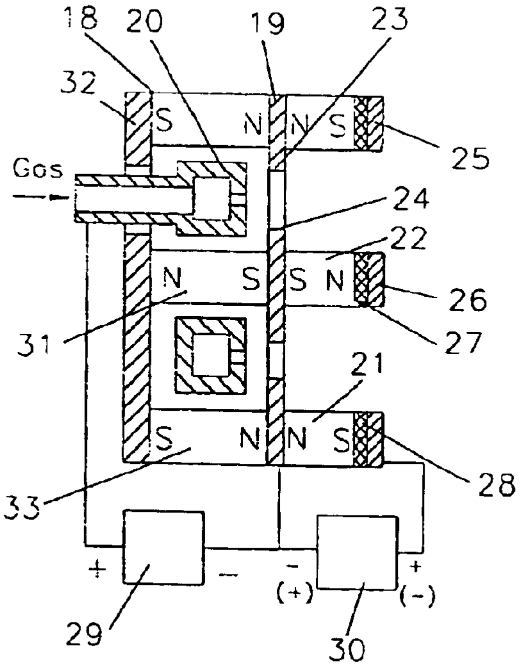
FIG. 11 is a diagrammatic sectional view of the ion source in accordance with the second embodiment of the invention and equipped with two voltage sources and additional permanent magnets.

The embodiment of the ion source shown in FIGS. 9 and 11 includes an additional closed loop-shape permanent magnet 33 arranged around anode 20 between end walls 19 and 32 of enclosure 18. The magnetic field induction vector (polarity) of additional magnet 33 is oriented parallel to the direction of ion emission and has opposite polarity with respect to the magnetic field induction vector of permanent magnet 21 arranged opposite thereof, on the outside of enclosure 18.

Pole gaps created between paired pole pieces 23,24 and 25,26 define a closed loop emission slot (an exit hole for ion emission). Each pole gap is comprised of two parallel rectilinear portions closed at their ends with closing curved portions. Configuration of the pole gaps is similar to that of the first embodiment of the invention (see FIG. 2). The width $C_1$ of the first linear portion of the first pole gap is greater than the width $C_2$ of the second linear portion of the same gap.

In the second embodiment of the invention, as well as in the first one, the ratio of width ($C_1$ or $C_2$) of the first pole gap and distance L between the surface of anode 20 and opposite edges of pole pieces 23 and 24 defining the first pole gap is within the optimum range of 1–20. The mean roughness of the working surface of anode 20 and the working surfaces of pole pieces 23,24,25 and 26 facing toward the discharge channel is 5 microns.

The ion source may comprise a separate gas-distributing unit, which is not structurally connected with anode 20. The construction of this unit is illustrated in FIGS. 7 and 8. Here, as in the first embodiment of the invention, the gas-distributing unit includes the end wall of the enclosure making a part of a magnetic circuit. The gas distributor is communicated with the enclosure cavity through outlet passages 14 having equal diameters and uniformly arranged in two rows over the enclosure internal wall along rectilinear portions of a closed loop emission slot. The enclosure wall is equipped with an inlet opening 15 communicated through a cascade of series-parallel connected passages 16 with two parallel collectors 17. Outlet passages 14 are connected to and arranged along collectors 17 at uniform distance H from one another (see FIG. 8). Inlet opening 15 is connected through an inlet pipe to the working gas supply system (not shown in the drawing). Passages 16 for connecting inlet opening 15 to outlet passages 14 have equal flow resistance providing for equal flow of the working gas supplied into the discharge volume through outlet passages 14. Uniform flow of the working gas through outlet passages 14 is also provided because each passage 16 is arranged at its point of connection with collector 17 between two adjacent outlet passages 14, while two outlet passages 14 are arranged between the points where two inlets of passages 16 are joined to collector 17. (see FIG. 7).

The ion source with an extended cylindroid beam, in accordance with the first embodiment of the invention, operates in the following manner.

With the working gas supply system on, the discharge volume between anode 3 and a cathode is uniformly filled with the working gas. The uniform supplying of the working gas along the exit hole for ion emission is provided by using the gas distributor illustrated in FIGS. 6,7 and 8. The working gas is delivered from the gas supply system into inlet opening 15 and further flows therefrom through a cascade of series-parallel connected passages 16 having equal gas resistance. The working gas is then passed from passages 16 at equal flow rates into collector 17 to which are connected outlet passages 14 arranged at uniform distance H from one another. Outlet passages 14 are arranged in two rows on the rear wall of enclosure 1.

Uniform working gas flow through each outlet passage 14 is provided because passages 16 are connected to collector 17 between two outlet passages 14, while two outlet passages 14 are arranged between the points where two adjacent inlets of passages 16 are joined to collector 17. With such arrangement of passages 16, the working gas flow is divided at the point of connection with collector 17 into two flows of equal flow rates, each of two flows being directed to one outlet passage 14. All the outlet passages 14 have equal section and are arranged uniformly with respect to the exit hole of the ion source so as to form a working gas flow with uniform section along the extended pole gaps. The distinctive feature of the gas distributor is that each of passages 16 connecting the single inlet opening 15 to outlet passages 14 have equal flow resistance independently of a number of passages 16. This result is realized by successive cascade-type dividing of the working gas flow into a multiplicity of gas flows having equal flow rates, because each subsequent passage has one inlet and two outlets equally spaced from inlet opening 15. Outlets of each preceding part of the cascade of passages serve as inlets for the subsequent cascade of passages. Because of equal effective cross sections, passages 16 formed in such manner have equal flow resistance. Depending upon the desired uniformity of the working gas distribution, the distance H between outlet passages 14 may be between 5 and 50 mm. The ion source may employ several gas-distributing units arranged on the rear wall of enclosure 1 along the exit hole (emission slot).

A longitudinal electric field is then created between anode 3 inside enclosure 1 and pole pieces 7,8 and 9,10 by means of a voltage source 11 (see FIGS. 1 and 3), and simultaneously a magnetic field is created in the first and second pole gaps between pole pieces 7 and 8, 9 and 10 by means of magnetomotive force sources (permanent magnets 5,6 12 and 13). The magnetic field induction vector in the pole gaps is perpendicular to the vector of electric field strength. An azimuthally closed electron drift occurs in the crossed electric and magnetic fields in the region of each pole gap as a result of the closed Hall current effect. The magnetic field strength in ion sources of this type (with a Hall current and a short acceleration zone) is selected so that electrons in the pole gaps become magnetized, with ions remaining unmagnetized. As a result, azimuthally closed electron currents are generated in the pole gaps of the ion source to serve for ionization of the working gas. The generated ions are accelerated under the action of electrical field.

Considering that self-maintained high-voltage DC gas discharges may be provided on the condition that the anode-and-cathode distance exceeds the glow discharge "cathode dark space", anode 3 is placed at a distance from the internal surfaces of enclosure 1 smaller than the "cathode dark space". Such mutual arrangement of enclosure 1 and anode 3 eliminates electrical breakdowns and the ignition of spurious electric discharges inside the ion source. Also, the results of experiments have shown that the ratio of width ($C_1$ or $C_2$) of the first pole gap and the anode-and-cathode distance L is of great importance for stable functioning of ion source in the selected mode of operation. The change in the pole gap width, which may be needed, for example, for changing the ratio of mean ion energy and the discharge voltage in case of transfer from the ion sputtering mode (a narrow exit hole) to the ion deposition mode (a wide exit hole), the ratio of $C_1$ or $C_2$ to L must be within the range of 1 to 20.

The effective usage of the second pole gap for additional ionization of the working gas and additional ion acceleration is enabled by appropriate selection of dimensions of the magnetic system providing a quadrapole configuration of the magnetic field with the magnetic induction value sufficient for generating a closed Hall current in the second pole gap.

To do so, the ratio of the width of each pole gap and the distance between the pole pieces (7 and 8) of the first pole gap and the pole pieces (9 and 10) of the second pole gap in the direction of ion emission must be not less than 0.05. So the selected distance between the pairs of pole pieces must not exceed $20.C_1$ or $20.C_2$. The results of experiments have shown that the given boundary value determines the influence of the effective usage of the magnetic field generated in the second pole gap upon the intensity of ion beam and the mean ion energy value over a full range of operating parameters of the ion source. The open four-pole (quadrapole) magnetic system composed of two pairs of pole pieces 7, 8 and 9, 10 and permanent magnets 5 and 6 generates a magnetic field in the pole gaps defined by the pole pieces. This field has a quadrapole (symmetric or asymmetric) spatial distribution.

Usage of the preferred embodiment of the ion source revealed in FIG. 1 allows the magnetic field in the pole gaps to be enhanced and the field uniformity to be improved. This is because the magnetic system includes additional magnetomotive force sources made in the form of permanent magnets 12 and 13. Magnet 12 serves as an internal magnetic flux conducting jumper of enclosure 1. Magnet 13 (or several magnets) is placed between end walls 2 and 4 around anode 3. Magnets 12 and 13 are arranged so that their magnetic field induction vectors have opposite polarity with respect to the magnetic field induction vector of the respective permanent magnet 5 or 6arranged opposite thereof, on the outside of enclosure 1. So magnets 6,12 and 5, 13 are single-pole with respect to pole pieces 8 and 7, respectively. As a result, the magnetic fluxes generated by the permanent magnets combine in the first pole gap. Such arrangement of the magnetic system allows strong magnetic fields with improved uniformity to be produced even in extended ion sources of large linear dimensions as compared to traditional magnetic systems. Along with this, usage of the additional magnetic system located inside enclosure 1 allows the magnetic field distribution to be smoothed in the first pole gap, as well as in the second pole gap.

Quadrapole magnetic system (symmetric or asymmetric) with pole pieces 7,8 and 9,10 defining the exit hole for ion emission (closed loop emission slot), promotes the increase in discharge and ion currents. This magnetic system provides for the stabilized discharge at the voltages from several hundred volts to several kilovolts and provides for operation free of gratuitous variations in discharge parameters.

In a number of cases, for example when strong magnets 5 and 6 or relatively narrow pole gaps are employed, it is advisable that only an outer magnetic system be used. The ion source depicted in FIG. 3 comprises an enclosure 1 formed of nonmagnetic material. The open magnetic system of the ion source is located on the outside of enclosure 1 and includes permanent magnets 5 and 6, pole pieces 7,8,9 and 10, and a magnetically permeable end wall 4. The disclosed magnetic system allows the magnetic flux to be prevented from leaking outside enclosure 1 and, as a result, the probability of electric breakdowns between anode 3 and walls of enclosure 1 to be sharply decreased.

The open magnetic system with magnetically permeable end wall 4, which acts as a magnetic shunt, increases the efficiency of ion acceleration in the first pole gap. This result derives from the fact that the arrangement of the magnetic shunt (magnetically permeable end wall 4) on the outer side of enclosure 1 along the entire surface thereof increases the magnetic field gradient in the space L. Thus, the full line in FIG. 4 depicts the curve of variations in the magnetic field induction values in the direction X of ion emission for the ion source whose rear end wall is made of nonmagnetic material, and the dashed line depicts the curve of variations in the magnetic field induction values for the ion source whose magnetic system includes magnetically permeable end wall 4—magnetic shunt. The pictorial dependence shows that the employment of the magnetic shunt increases the magnetic field gradient in the region of anode 3 and partially in the region of pole pieces 7 and 8 of the first pole gap. The usage of the magnetic shunt does not exert a substantial effect upon the distribution of magnetic field in the space between the first and second pole gaps.

The increase in the magnetic field gradient in the region of the pole gap promotes localizing of the ionization and ion acceleration zone resulting in an increase in the intensity of generated ion beams, improvement of ion energy distribution in the ion beam and reduction of energy loss during the working gas ionization and ion acceleration process. Also it has been found experimentally that an increase in the magnetic field gradient in the anode-and-cathode space of the closed electron drift ion source increases the discharge stability and allows the discharge and ion currents to be increased.

The closed electron drift (Hall) currents produced in the crossed electric and magnetic fields in turn induce their internal magnetic fields which interact with the magnetic field generated by the magnetic system of the ion source. The pictorial representation of interaction of magnetic fields in the first and second pole gaps shown in FIG. 5 depicts separate fluxes of electron drift currents $I_{H1}$ and $I_{H2}$ in the first and second pole gaps between pole pieces 7, 8 and 9, 10, respectively.

When traditional magnetic systems are used in closed electron drift ion sources, the direction of the internal magnetic field of the electron drift current is opposite to the direction of the magnetic field generated by the magnetic system of the ion source in the region of ion generation and acceleration. This effect causes the reduction of the magnetic field in the discharge channel of the traditional type ion source and, as a consequence, the deterioration of operating parameters thereof. When a four-pole (quadrapole) magnetic system is used, as is evident from the diagram presented in FIG. 5, the directions of the electron drift currents $I_{H1}$ and $I_{H2}$ are mutually opposite and their internal magnetic fields $B_{H1}$ and $B_{H2}$ partially compensate one another in the pole gaps.

Along with this, the magnetic fields are redistributed in the pole gaps of the magnetic system. The direction of the internal magnetic field $B_{H2}$ of the electron drift current $I_{H2}$ in the second pole gap coincides with the direction of the magnetic field $B_1$ generated by the magnetic system in the first pole gap. Combined magnetic fields $B_{H2}$ and $B_1$ promote strengthening of the magnetic field in the first pole gap, i.e., in the region of the discharge channel where the working gas is initially ionized and ions are accelerated. Strengthening of the magnetic field in this spatially limited region stabilizes the discharge, increases the discharge and ion currents and widens the range of discharge voltage.

A region having a zero cross magnetic field induction vector is created in the four-pole (quadrapole) magnetic system between the pole pieces of the first and second pole gaps (see FIG. 5). The magnetic field induction vectors at both sides of this region have opposite direction. Electrons are not magnetized in the mentioned spatial region, and, as a consequence, the potential of plasma in this region differs from that at the boundary regions where the magnetic field induction is other than zero and electrons are magnetized. This phenomenon may be used for regulating the energy of ions through controlling the potential of the spatial regions with magnetized electrons.

The magnitude and configuration of the magnetic field depends upon absolute and relative dimensions of the pole gaps and the anode-and-cathode distance L. These dimensions determine the shape and dimensions of the discharge zone and therefore exert an effect upon the mean energy of ions in the generated ion beam. The wider is the pole gap at the constant value L of the gap, the lower is the mean energy of ions. This is due to the increased amount of ions created at low-voltage equipotentials of the electric field available in the anode-and-cathode space. The mean ion energy and discharge voltage ratio is decreased therewith.

The effectuation of some process objectives requires obtaining of an ion beam with different current densities and mean energy of ions for each of the parallel rectilinear portions defining the closed loop emission hole. This is done by using an ion source having the width ($C_1$) of one of rectilinear portions of the pole gap exceeding the width ($C_2$) of other rectilinear portion of this pole gap (see FIGS. 1 and 2). In the disclosed ion source two operating modes are realized, i.e. with narrow and wide emission holes. As rioted above, the mean energy of ions emitted through the narrow emission hole is higher than the mean energy of ions emitted through the wide emission hole, with the value of the closed (drift) electron current remaining the same in the two parallel rectilinear slots interconnected at their ends with closing curved portions owing to the continuity of the current. However, the current density depends upon the discharge channel section, and the value of the latter is determined by the $C_1/L$ or $C_2/L$ ratio for each rectilinear portion of the closed loop emission hole. With equal anode-and-cathode distance L, the electron drift current density in the narrow rectilinear portion of the exit hole is higher than the current density in the wide rectilinear portion. As a result, the density of ion current extracted from the narrow rectilinear portion is higher than the density of ion current extracted from the wide rectilinear portion of the emission slot.

In the ion source with a short acceleration zone, the whole of the electric potential applied is concentrated in the region adjacent to the anode, within the narrow layer by an order of several Larmor radii of an electron. In case of presence of asperities on the working surface of anode 3 (for example, roughness created by the machining operation), the electric field in the anode layer is deformed. The electric field intensity becomes concentrated in these asperities. Owing to the diffusion of electrons from the anode layer, the concentration of electrons in the anode layer lessens, which results, on the whole, in deteriorating the conditions for working gas ionization and decreasing the discharge intensity. As a result of difficult cooling process and high density of the electron current, these asperities may be heated up to melting and evaporating temperatures. This phenomenon in turn may cause a sharp increase in the plasma concentration due to vapors ionization, a further increase in the electron current density and further heating of the anode local region. This in turn may cause fluctuations and instability of discharge, and in case of sufficiently high current densities may lead to the failure of the anode. Considering the possibility of aforesaid undesired effects during operation of the ion source designed in accordance with the present invention, the anode with the roughness of the working surface not in the excess of 10 microns is employed. Also for the aforesaid reasons, pole pieces having roughness on their surfaces facing toward the discharge channel not in the excess of 10 microns are used during operation of the ion source.

The achievement of the above results is confirmed by the obtained experimental data. With the usage of the extended cylindroid beam-type ion source in accordance with the first embodiment of the present invention having an open magnetic circuit, the following parameters are obtained.

The ion source of the first example of the embodiment had the following dimensions: the width C of each rectilinear portion of the first pole gap was approximately 2 mm, the length L of the rectilinear portion of the first pole gap was approximately 2,200 mm, the width D of each rectilinear portion of the second pole gap was about 24 mm, the anode-and-cathode distance L was about 2 mm, the pole piece spacing h in the first and second pole gaps was about 16 mm. Argon was used as a working gas.

With the strength of the magnetic field in the first pole gap of about 3,000 Oe and discharge voltage U of about 3,000 V, the discharge current 1 was about 4.6 A, the ion current $I_i$ was about 3.2 A, the mean energy $E_i$ of ions in the ion beam was about 1,400 eV, with the inhomogeneity of the ion current density across the beam section not exceeding plus and minus 3%.

The second example of the embodiment of the ion source had the following dimensions: the width C of each rectilinear portion of the first pole gap was about 18 mm, the length L of the rectilinear portion of the first pole gap was 2,200 mm, the width D of each rectilinear portion of the second pole gap was about 32 mm, the anode-and-cathode distance L was about 2 mm, the pole piece spacing h in the first and second pole gaps was about 16 mm. Argon was used as a working gas.

With the magnetic field strength in the first pole gap of about 800 Oe and the discharge voltage U of about 1,500 V, the discharge current I was about 12.5 A, ion current Ii of about 7.2 A, the mean energy Ei of ions in the ion beam was about 90 eV, with the nonhomogeneity of the ion current density across the ion beam section not exceeding plus and minus 3%.

The extended cylindroid beam-type ion source in accordance with the second embodiment of the invention (see FIGS. 9 through 12) operates similar to the above mentioned operation of the ion source in accordance with the first embodiment of the invention.

With the working gas supply system on, the working gas is uniformly supplied into the discharge volume between an anode 20 and a cathode, with pole pieces 23 and 24 integral with an end wall 19 of an enclosure 18 serving as the cathode. The uniform supplying of the working gas along the closed loop emission slot is provided by means of a gas distributor illustrated in FIGS. 7 and 8.

A voltage source 29 creates a longitudinal electric field between anode 20 and pole pieces 23 and 24 (see FIGS. 9 through 12). Simultaneously with this, a magnetic field is produced between pole pieces 23,24 and 25,26 in the first and second pole gaps, with the magnetic field induction vector being perpendicular to the electric field induction vector. Permanent magnets 21 and 22 located between pole pieces off the first and second pole gaps serve as magnetomotive force sources. Also, additional permanent magnets may be used, with the first magnet serving as an internal magnetic flux conducting jumper 31 of enclosure 18 and second magnet 33 being arranged around anode 20 to define a side wall for enclosure 18 (see FIGS. 9 and 11). The additional magnets used in the ion source enhance the magnetic field in the pole gaps and improve the field uniformity.

In the crossed electric and magnetic fields, in the vicinity of each pole gap, an azimuthally closed electron drift is produced by a Hall current effect. As a result, azimuthally closed electron currents are generated in the pole gaps of the ion source to serve for ionization of the working gas. The generated ions are accelerated under the action of electrical field.

The efficient usage of the second pole gap for additional ionizing of the working gas and additional ion acceleration is enabled by appropriate selection of dimensions of the magnetic system, providing a quazi-quadrapole configuration of the magnetic field with the induction value sufficient for producing a closed Hall current in the second pole gap. To satisfy this condition, the ratio of width of each pole gap and distance between pole pieces of the first (pole pieces 23 and 24) and second (pole pieces 25 and 26) pole gaps downstream in ion emission direction is not less than 0.05.

Figure 12:
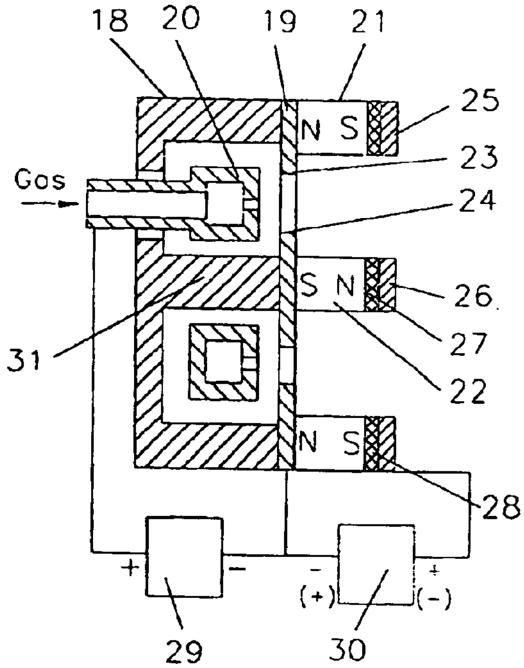
FIG. 12 is a diagrammatic sectional view of the ion source in accordance with the second embodiment of the invention and equipped with two voltage sources.

The magnetic field may be created in the region of the exit hole of the ion source by means of various embodiments of the magnetic system:

in the form of an open magnetic circuit defined by pole pieces 23 through 26 and a magnetically permeable end wall 32 (see FIGS. 9 and 11);

in the form of a partially closed loop magnetic circuit composed of magnetically permeable enclosure 18 and pole pieces 23 through 26 (see FIGS. 10 and 12);

in the form of an open magnetic circuit defined only by pole pieces 23 through 26 in case the enclosure 18 is fabricated from nonmagnetic material (see Figures 10 and 12).

Figure 2:
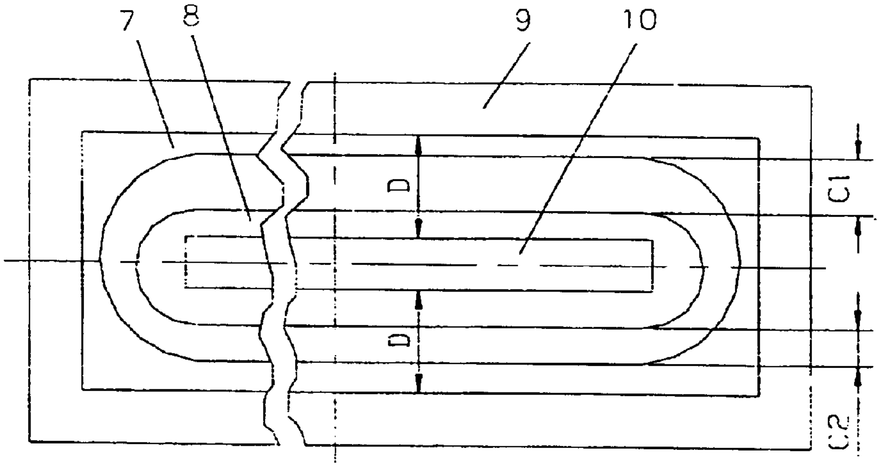
FIG. 2 is a side view of the ion source illustrated in FIG. 1 from the exit hole for ion emission.

An ion beam with various current density and the mean energy of ions for each of the parallel rectilinear portions defining the exit hole for ion emission is produced by means of the ion source having the width ($C_1$) of one of the linear portions of the pole gap exceeding the width ($C_2$) of the second rectilinear portion of the same pole gap (similar to the first embodiment of the invention, as it is shown in FIG. 2).

To eliminate the discharge fluctuations and instability, as well as to improve the service life of the ion source and increase the range of discharge intensities available, it is advisable that the roughness of anode working surface not be in the excess of 10 microns. Moreover, pole pieces with the roughness of their working surface facing toward the discharge channel also not exceeding 10 microns are recommended for usage.

The ion source according to the second embodiment of the invention provides for regulation of the intensity and energy of ions. This is realized owing to the presence in the space between two pairs of pole pieces 23,24 and 25,26 of the four-pole (quadrapole) magnetic system of the spatial region with nonmagnetized electrons, where the value of the radial magnetic field induction vector is zero.

The energy and intensity of the ion beam may be regulated by electrically isolating the pole pieces 25 and 26 of the second pole gap. The electrical isolation is effected by using permanent magnets 21 and 22 manufactured of the material possessing high resistivity or, alternatively, by using dielectric inserts 27 and 28 between pole pieces 25, 26 and permanent magnets 21 and 22 (see FIGS. 9 through 12).

Pole pieces 25, 26 of the second pole gap may be at the floating potential of the system (see FIGS. 9 and 10) or may be connected to positive or negative terminals of a voltage source 30 (see FIGS. 11 and 12), with pole pieces 23 and 24 being connected to opposite terminals of voltage source 30.

During operation of the ion source, the spatial plasma region with the zero radial magnetic field induction vector may be at the floating potential of the system if the pole pieces 25 and 26 are not connected to voltage source 30. Upon connection of the pole pieces to the respective terminals of voltage source 30, the plasma region with the zero magnetic field may be at positive potential and may serve as a virtual anode relative to pole pieces 23 and 24 or may be at negative potential and may serve as a virtual cathode (see FIGS. 11 and 12). In the two latter cases, the second stage with the closed electron drift is realized in the ion source and allows the energy of ions in the beam to be regulated by additional acceleration or deceleration thereof. The aforesaid advantage is provided by using the four-pole (quadapole) magnetic system with the predetermined dimension ratio of the pole gaps and the distance, between two successively arranged pole gaps selected in accordance with the invention.

The achievement of above results is verified by the obtained experimental data. During operation of the ion source in accordance with the second embodiment of the invention in one of the working modes the following parameters were obtained: the mean energy $E_i$ of ions in the ion beam was about 600 eV, inhomogeneity of the ion current density across the ion beam section did not exceed plus and minus 3%. With said operating parameters, the voltage was supplied to the electrically isolated pole pieces of the second pole gap of the positive or negative polarity for regulating the mean energy of ions in the beam within the range of from +42% to −20% of the value $E_i$.

Industrial Applicability

The presented experimental data indicate that there exists the possibility of generating the intensive ion beams with the homogeneous distribution of current density across the ion beam section along the emission hole (slot), as well as of controlling the energy of ions in the ion beam over a sufficiently wide range. Though the described examples of embodiments of the invention belong to the extended cylindroid beam-type ion sources most suitable for application in a broad range of processes, the invention may be also used in other types of ion sources having closed loop exit hole for ion emission. As an example, the invention may be employed in the similar manner and the disclosed results may be achieved in the closed electron drift ion sources having traditional annular shape of the closed loop exit hole for ion emission.

The invention may be used in different types of technological units designed for ion-beam processing of articles surfaces by means of intensive ion beams. The extended cylindroid beam ion source may be incorporated in these units and employed for ion beam and reactive ion beam etching of materials, for cleaning, activating and polishing of parts surfaces, as well as for vacuum deposition of coatings.

What is claimed is:

1. An ion source comprising an enclosure (1) with a closed loop exit hole for ion emission, an anode (3) arranged inside enclosure (1) opposite to the exit hole, a gas distributor communicated with the cavity of enclosure (1), a cathode, with enclosure (1) serving at least a part of the cathode, and a magnetic system composed of at least one magnetomotive force source made in the form of a permanent magnet (5 or 6) and arranged on the outside of enclosure (1) along the edge of the closed loop exit hole, with an end wall (2) of enclosure (1) being provided with the closed loop exit hole and manufactured of magnetically permeable material, the parts of said end wall separated by the closed loop exit hole serving as pole pieces (7, 8) of the magnetic system and defining the first pole gap, with the magnetic system comprising pole pieces (9, 10) defining the second pole gap formed as a closed loop exit hole and arranged opposite the first pole gap in the direction of ion emission, and the magnetomotive force source being located in space between the pole pieces of the first and second pole gaps, wherein the ratio of width of each pole gap and distance between the pole pieces of the first and second magnetic gaps in the direction of ion emission is not less than 0.05, with end wall (2) of enclosure (1) at the side opposite to the exit hole being manufactured of magnetically permeable material and defining in conjunction with pole pieces of the first and second pole gaps an open magnetic circuit.

2. An ion source as claimed in claim 1, wherein said magnetic system is composed of permanent magnets (5, 6) located between pole pieces (7, 8) of the first pole gap and pole pieces ((9, 10) of the second pole gap along opposite edges of a closed loop exit hole, with magnetic field induction vectors of permanent magnets (5, 6) arranged at opposite edges of the exit hole being oriented parallel to the direction of ion emission and having opposite polarity.

3. An ion source as claimed in claim 1, wherein enclosure (1) is provided with an internal magnetic flux conducting jumper (12) for connecting opposite end walls of enclosure (1), said anode (3) is made of closed shape conforming to that of said exit hole and is arranged around the internal magnetic flux conducting jumper (12) of enclosure (1).

4. An ion source as claimed in claim 3, wherein an additional permanent magnet serves as internal magnetic flux conducting jumper (12), with the magnetic field induction vector of the additional magnet being oriented parallel to the direction of ion emission and having opposite polarity with respect to the magnetic field induction vector of permanent magnet (6) arranged opposite thereof, on outside of the enclosure.

5. An ion source as claimed in claim 1, wherein at least one additional permanent magnet (13) is arranged around anode (3) between magnetically permeable end walls (2, 4) of the enclosure, with the magnetic field induction vector of additional magnet (13) being oriented parallel to the direction of ion emission and having opposite polarity with respect to the magnetic field induction vector of magnet (5) arranged opposite thereof on outside of the enclosure.

6. An ion source as claimed in claim 1, wherein each pole gap defining an exit hole for ion emission is formed as a closed loop slot shaped emission hole and is composed of two elongated parallel rectilinear portions closed at their ends with curved closing portions.

7. An ion source as claimed in claim 6, wherein the width of one rectilinear portion of at least one of pole gaps is greater than the width of other rectilinear portion of the same pole gap.

8. An ion source as claimed in claim 1, wherein the ratio of width of the first pole gap and the distance between the surface of anode (3) and opposite edges of pole pieces (7, 8) defining the first pole gap is between 1 and 20.

9. An ion source as claimed in claim 1, wherein the roughness of the working surface of anode (3) and/or the working surfaces of pole pieces (7, 8,9 and 10) facing toward the discharge channel does not exceed 10 microns.

10. An ion source as claimed in claim 1, wherein a gas distributor comprises at least one gas distributing unit with outlet passages (14) uniformly arranged along said closed loop exit hole for ion emission, with outlet passages (14) of the gas distributing unit having equal section and communicating with a single inlet opening (15) through series-parallel connected passages (16) having equal flow resistance.

11. An ion source as claimed in claim 10, wherein outlet passages (14) are connected to a collector (17) to which are joined series-parallel connected passages (16) between two adjacent outlet passages (14), while two outlet passages (14) are arranged between the points where two adjacent inlets of series-parallel connected passages (16) are joined to collector (17).

12. An ion source as claimed in claim 10, wherein said gas distributing unit is arranged in enclosure (1) on side opposite to said exit hole for ion emission.

13. An ion source as claimed in claim 10, wherein at least a part of the gas distributing unit serves as a magnetic circuit element.

14. An ion source comprising an enclosure (18) with a closed loop exit hole for ion emission, an anode (20) arranged inside enclosure (18) opposite to the exit hole, a gas distributor communicating with the cavity of enclosure (18), a cathode, with enclosure (18) defining at least a part of the cathode, and a magnetic system including at least one magnetomotive force source made in the form of a permanent magnet (21 or 22) and arranged on the outside of enclosure (18) along the edge of the closed loop exit hole, with an end wall (19) of enclosure (18) being provided with the exit hole and manufactured of magnetically permeable material, and with parts of end wall (19) separated by the closed loop exit hole serving as pole pieces (23, 24) of a magnetic system and defining the first pole gap, the magnetic system including pole pieces (25, 26) defining the second pole gap made in the form of a closed loop exit hole and arranged opposite the first pole gap in the direction of ion emission, and the magnetomotive force source being arranged in space between pole pieces (23, 24) of the first pole gap and pole pieces (25, 26) of the second pole gap, wherein the ratio of width of each pole gap and distance between pole pieces of the first and second magnetic gaps in the direction of ion emission is not less than 0.05, with pole pieces (25, 26) defining the second pole gap being electrically isolated from the enclosure and from the pole pieces defining the first pole gap.

15. An ion source as claimed in claim 14, wherein a magnetic system includes permanent magnets (21, 22) arranged between pole pieces (23, 24) of the first pole gap and pole pieces (25, 26) of the second pole gap along opposite edges of the closed loop exit hole, with the magnetic field induction vectors of permanent magnets (21, 22) arranged at opposite edges of the exit hole being oriented parallel to the direction of ion emission and having opposite polarity.

16. An ion source as claimed in claim 14, wherein enclosure (18) is manufactured of magnetically permeable material.

17. An ion source as claimed in claim 14, wherein a permanent magnet (21 or 22) is manufactured of material possessing high resistivity.

18. An ion source as claimed in claim 14, wherein a dielectric insert is arranged between pole pieces (25, 26) defining the second pole gap and permanent magnet (21 or 22).

19. An ion source as claimed in claim 14, wherein pole pieces (25, 26) defining the second pole gap are at the floating potential of the system.

20. An ion source as claimed in claim 14, wherein pole pieces (23, 24) of the first pole gap and pole pieces (25, 26) of the second pole gap are connected to opposite polarity terminals of a voltage source (29).

21. An ion source as claimed in claim 14, wherein enclosure (18) is provided with an internal magnetic flux conducting jumper (31) for connecting opposite end walls (19, 32) of the enclosure, with anode (20) being made of closed loop shape conforming to that of the exit hole for ion emission and arranged around internal magnetic flux conducting jumper (31) of enclosure (18).

22. An ion source as claimed in claim 21, wherein an additional permanent magnet serves as internal magnetic flux conducting jumper (31), with the magnetic field induction vector of the additional magnet being oriented parallel to the direction of ion emission and having opposite polarity with respect to the magnetic filed induction vector of magnet 22 arranged opposite thereof on the outside of enclosure (18).

23. An ion source as claimed in claim 14, wherein at least one additional permanent magnet (33) is arranged around anode (20) between magnetically permeable end walls (19, 32) of enclosure (18), with the magnetic filed induction vector of the additional magnet being oriented parallel to the direction of ion emission and having opposite polarity with respect to the magnetic field induction vector of magnet (21) arranged opposite thereof on outside of enclosure (18).

24. An ion source as claimed in claim 14, wherein each pole gap defining a closed loop exit hole for ion emission is made in the form of a closed loop emission slot and is composed of two elongated parallel rectilinear portions closed at their ends by curved closing portions.

25. An ion source as claimed in claim 24, wherein the width of one rectilinear portion of at least one pole gap is greater than the width of other rectilinear portion of the same pole gap.

26. An ion source as claimed in claim 14, wherein the ratio of width of the first pole gap and distance between the surface of anode (20) and opposite edges of pole pieces (23, 24) defining the first pole gap is between 1 and 20.

27. An ion source as claimed in claim 14, wherein the roughness of the working surface of anode (20) and/or working surfaces of pole pieces (23, 24, 25, 26) at the side facing toward the discharge channel does not exceed 10 microns.

28. An ion source as claimed in claim 14, wherein the gas distributor comprises at least one gas distributing unit with outlet passages (14) uniformly arranged along the closed loop exit hole for ion emission, with outlet passages (14) of the gas distributing unit having equal section and communicating with a single inlet opening (15) through series-parallel connected passages (16) having equal flow resistance.

29. An ion source as claimed in claim 28, wherein outlet passages (14) are connected to a collector (17) to which are joined series-parallel connected passages (16) in the region between two adjacent outlet passages (14), while two outlet passages (14) are arranged between the point where two adjacent inlets of series-parallel connected passages (16) are joined to collector (17).

30. An ion source as claimed in claim 28, wherein a gas distributing unit is arranged inside enclosure (18) at the side opposite the exit hole for ion emission.

31. An ion source as claimed in claim 28, wherein at least a part of the gas distributing unit serves as an element of a magnetic circuit.

* * * * *